(12) United States Patent
Hanaoka

(10) Patent No.: US 9,251,998 B2
(45) Date of Patent: Feb. 2, 2016

(54) PLASMA PROCESSING APPARATUS

(75) Inventor: Hidetoshi Hanaoka, Kurokawa-gun (JP)

(73) Assignee: TOKYO ELECTRON LIMITED (JP)

( * ) Notice: Subject to any disclaimer, the term of this patent is extended or adjusted under 35 U.S.C. 154(b) by 536 days.

(21) Appl. No.: 13/334,400

(22) Filed: Dec. 22, 2011

(65) Prior Publication Data

US 2012/0160418 A1    Jun. 28, 2012

Related U.S. Application Data

(60) Provisional application No. 61/432,788, filed on Jan. 14, 2011.

(30) Foreign Application Priority Data

Dec. 27, 2010  (JP) .................................. 2010-290508

(51) Int. Cl.
*H01L 21/00*  (2006.01)
*C23C 16/00*  (2006.01)
*H01J 37/32*  (2006.01)

(52) U.S. Cl.
CPC ..... *H01J 37/32082* (2013.01); *H01J 37/32532* (2013.01); *H01J 37/32568* (2013.01); *H01J 37/32623* (2013.01); *H01J 2237/334* (2013.01)

(58) Field of Classification Search
CPC .................... H01J 37/32027; H01J 37/32036; H01J 37/32045
USPC ......... 118/723 E, 723 R; 156/345.43, 345.44, 156/345.45, 345.46, 345.47
See application file for complete search history.

(56) References Cited

U.S. PATENT DOCUMENTS

| 5,246,532 | A | * | 9/1993 | Ishida ...................... 156/345.46 |
| 5,919,332 | A | * | 7/1999 | Koshiishi et al. ........ 156/345.47 |
| 2006/0037703 | A1 | * | 2/2006 | Koshiishi et al. ........ 156/345.47 |
| 2006/0065369 | A1 | | 3/2006 | Dhindsa et al. |
| 2006/0066247 | A1 | * | 3/2006 | Koshiishi et al. ........ 315/111.21 |

(Continued)

FOREIGN PATENT DOCUMENTS

| CN | 101316949 | 12/2008 |
| CN | 101740297 | 6/2010 |

(Continued)

OTHER PUBLICATIONS

Han K H et al., Plasma etching apparatus for semiconductor device manufacturing apparatus, has electrostatic chuck holding wafer to be etched, and focus ring with tapered surface surrounding edge of wafer, Apr. 2008, abstract.*

*Primary Examiner* — Sylvia R MacArthur
*Assistant Examiner* — Anna Crowell
(74) *Attorney, Agent, or Firm* — Cantor Colburn LLP

(57) ABSTRACT

A plasma processing apparatus includes: a radio frequency (RF) power source which applies an RF power to a lower electrode; a direct current (DC) power source which applies a DC voltage to an upper electrode; a ground member for the DC voltage that is a ring shape formed of a conductive material, that is arranged in the processing chamber such that at least a part of the ground member is exposed to the processing space, and that forms a ground potential with respect to the DC voltage applied to the upper electrode; and a plurality of vertical movement mechanisms which move the ground member for the DC voltage in a vertical direction to adjust a grounding state of the ground member for the DC voltage.

13 Claims, 7 Drawing Sheets

(56) References Cited

U.S. PATENT DOCUMENTS

| | | | |
|---|---|---|---|
| 2007/0111339 A1* | 5/2007 | Wege et al. | 438/10 |
| 2007/0221332 A1* | 9/2007 | Honda et al. | 156/345.47 |
| 2007/0224817 A1* | 9/2007 | Honda et al. | 438/689 |
| 2008/0236752 A1* | 10/2008 | Honda | 156/345.43 |
| 2009/0101283 A1* | 4/2009 | Iwata | 156/345.28 |
| 2009/0242516 A1* | 10/2009 | Honda et al. | 216/71 |
| 2010/0116436 A1* | 5/2010 | Kitajima et al. | 156/345.1 |
| 2010/0176086 A1* | 7/2010 | Iwata | 216/71 |
| 2012/0003836 A1* | 1/2012 | Kellogg et al. | 438/710 |

FOREIGN PATENT DOCUMENTS

| | | | |
|---|---|---|---|
| JP | 2006186323 | | 7/2006 |
| JP | 2007048826 | | 2/2007 |
| JP | 2009239222 | | 10/2009 |
| JP | 2010-114313 | | 5/2010 |
| JP | 2010238980 | | 10/2010 |
| KR | 2004050079 | A * | 6/2004 |
| KR | 2008029609 | A * | 4/2008 |

* cited by examiner

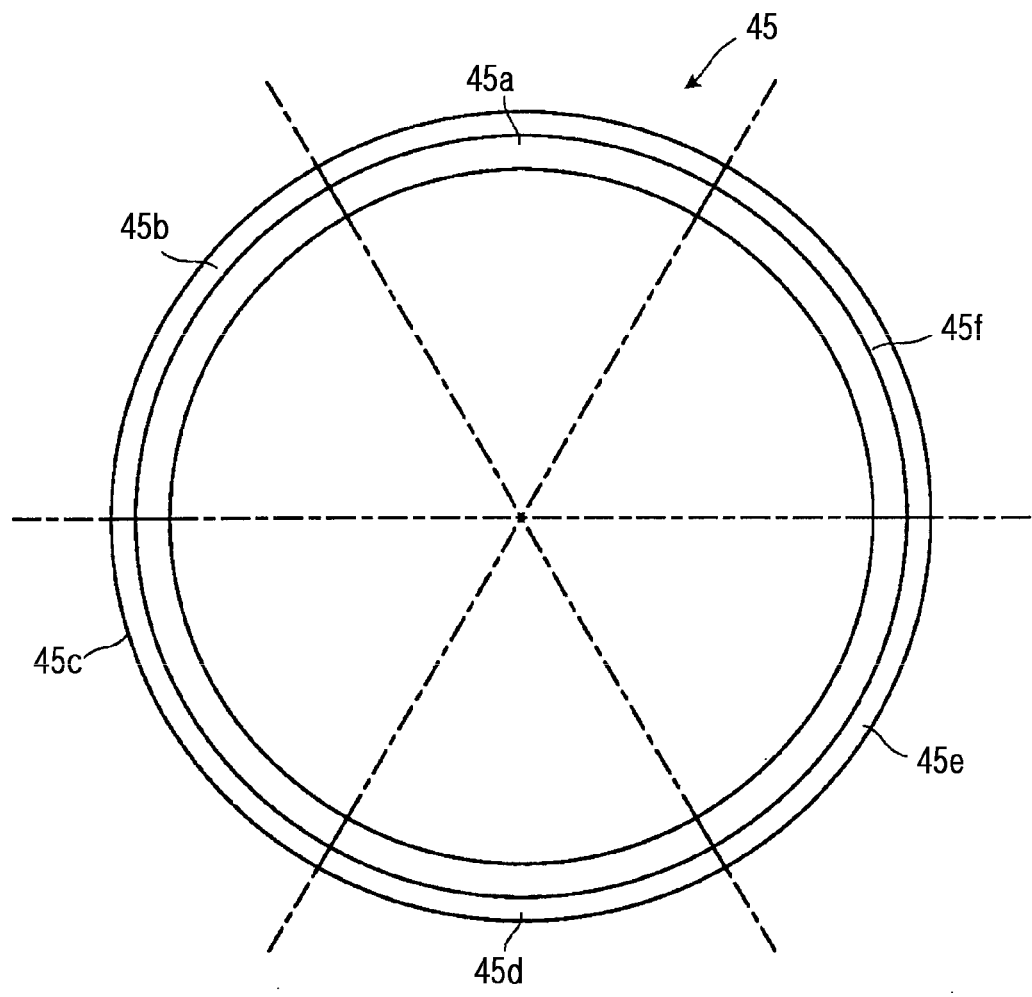

2.5nm/min, ±0.7%

6.0nm/min, ±1.7%

2.5nm/min, ±0.7%

2.4nm/min, ±0.7%

PLASMA PROCESSING APPARATUS

CROSS-REFERENCE TO RELATED PATENT APPLICATIONS

This application claims the benefit of Japanese Patent Application No. 2010-290508, filed on Dec. 27, 2010, in the Japan Patent Office, U.S. Patent Application Ser. No. 61/432,788, filed Jan. 14, 2011, in the United States Patent and Trademark Office, the disclosures of which are incorporated herein in their entireties by reference.

BACKGROUND OF THE INVENTION

1. Field of the Invention

The present invention relates to a plasma processing apparatus.

2. Description of the Related Art

Conventionally, in manufacturing semiconductor devices, a plasma processing apparatus which performs various processes, for example, an etching process or a film forming process, by applying plasma onto a substrate (for example, a semiconductor wafer) disposed on a holding stage in a processing chamber is used. As the plasma processing apparatus, there is known a capacity coupled plasma processing apparatus in which a pair of opposite electrodes are configured by arranging an upper electrode on a ceiling portion or the like in the processing chamber to face the holding stage on which the substrate is held and the holding stage as a lower electrode.

In the above capacity coupled plasma processing apparatus, as radio frequency (RF) powers applied between the upper and lower electrodes, a first RF power having a relatively high frequency for generating plasma and a second RF power having a frequency lower than that of the first RF power for implanting ions are applied to the holding stage, that is, the lower electrode.

In addition, a plasma processing apparatus in which an RF power is applied to a lower electrode and a direct current (DC) voltage is applied to an upper electrode is well known in the art. In the plasma processing apparatus in which the DC voltage is applied to the upper electrode as described above, if a ground of the RF power is coated with ceramic or the like, a ground member for the DC voltage needs to be provided additionally for forming a ground (ground voltage) with respect to the DC voltage. As the ground member for the DC voltage, a conductive ring shaped member, for example, a ring shaped member formed of silicon, is provided to surround a holding stage so that the ring shaped member is exposed in a processing chamber. The ring shaped member may be configured by melting and bonding a plurality of arc-shaped members to each other (for example, refer to Patent Document 1).

As described above, in the plasma processing apparatus in which the RF power is applied to the lower electrode and the DC voltage is applied to the upper electrode, the ground member for the DC voltage, which functions as the ground with respect to the DC voltage, is provided to be exposed in the processing chamber. As a thorough examination result of the present inventor, in the plasma processing apparatus having the above structure, uniformity of process in a circumferential direction of a substrate is degraded according to an installation state of the conductive ring shaped member or the like as the ground member for the DC voltage, and thus the plasma processing may be biased. The biased processing caused according to the installation state of the conductive ring shaped member has to be corrected by opening the processing chamber to the atmosphere and adjusting the installation state of the conductive ring shaped member, and the correction takes time and effort, thereby resulting in degradation of productivity.

(Patent Document 1) Japanese Laid-open Patent Publication No. 2010-114313

SUMMARY OF THE INVENTION

The present invention provides a plasma processing apparatus capable of performing processes uniformly and efficiently, by easily correcting a biased state of a process caused according to an installation state of a ground member for a direct current (DC) voltage that is applied to an upper electrode.

According to an aspect of the present invention, there is provided a plasma processing apparatus including: a processing chamber having a processing space inside; a lower electrode arranged in the processing chamber and functioning as a holding stage where a substrate to be processed is held; an upper electrode arranged in the processing chamber to face the lower electrode; a radio frequency (RF) power source which applies an RF power to the lower electrode; a direct current (DC) power source which applies a DC voltage to the upper electrode; a processing gas supply mechanism which supplies a processing gas that is plasmatized to the processing space; a ground member for the DC voltage which has an overall ring shape, is formed of a conductive material, is arranged in the processing chamber such that at least a part of the ground member is exposed to the processing space, and forms a ground potential with respect to the DC voltage applied to the upper electrode; and a plurality of vertical movement mechanisms which move the ground member for the DC voltage in a vertical direction to adjust a grounding state of the ground member for the DC voltage.

BRIEF DESCRIPTION OF THE DRAWINGS

The above and other features and advantages of the present invention will become more apparent by describing in detail exemplary embodiments thereof with reference to the attached drawings in which:

FIG. 3 is a schematic view of principal parts in the plasma etching apparatus of FIG. 1, FIGS. 4A through 4C are graphs showing examination results of an influence of a grounding state of a ground member for a direct current (DC) voltage on uniformity of process.

DETAILED DESCRIPTION OF THE INVENTION

Figure 1:
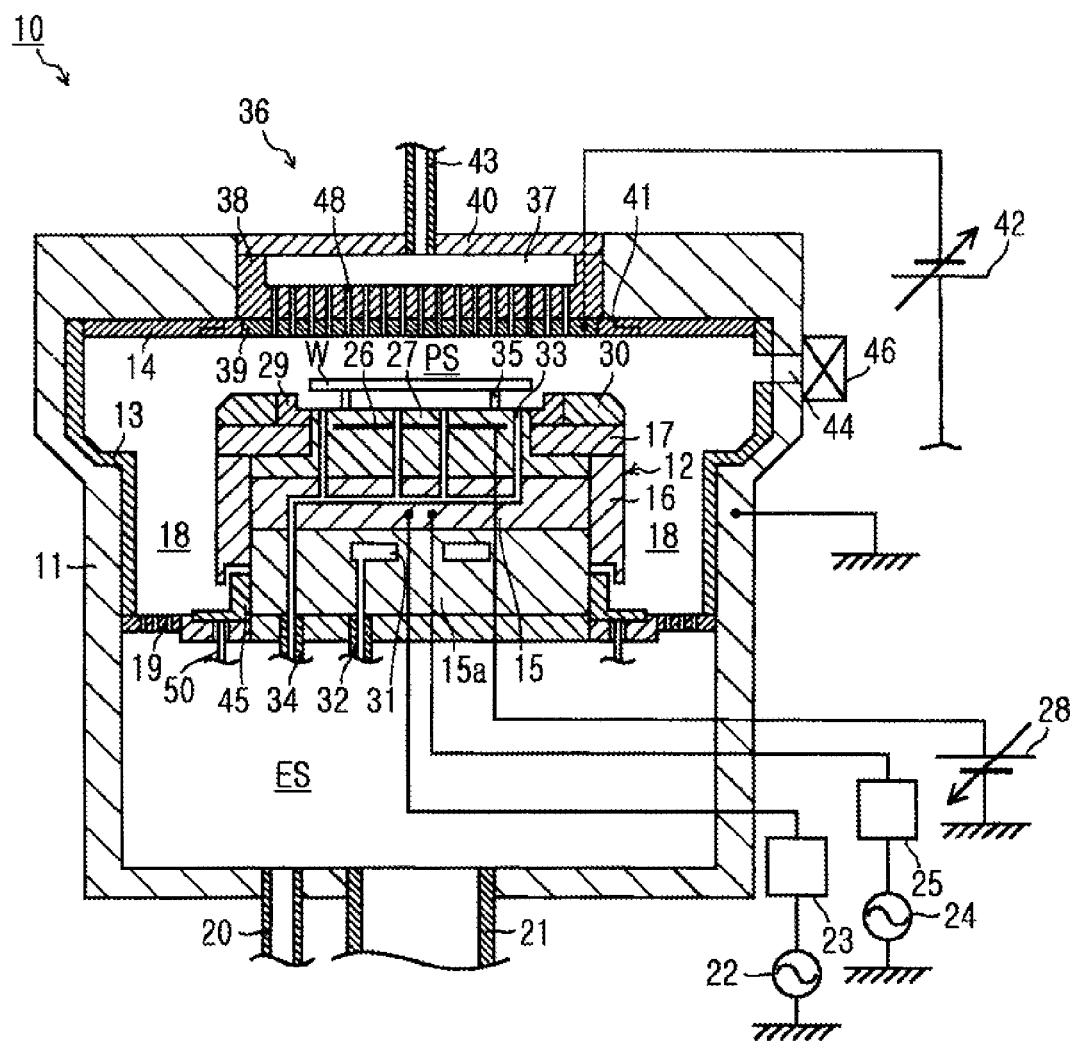
FIG. 1 is a schematic view of a plasma etching apparatus according to an embodiment of the present invention.

Hereinafter, embodiments of the present invention will be described with reference to accompanying drawings. FIG. 1 is a schematic longitudinal-sectional view of a plasma etching apparatus 10 as a plasma processing apparatus according to an embodiment of the present invention.

The plasma etching apparatus 10 includes a processing chamber 11 that is formed airtightly and forms a processing space PS therein. The processing chamber 11 is formed as a cylindrical shape and formed of, for example, aluminum having a surface that is anodized. The processing chamber 11 includes a holding stage 12 formed as a cylindrical shape and holding a semiconductor wafer W, ie., a substrate to be processed, in a horizontal direction.

An inner side wall of the processing chamber 11 is covered by a side wall member 13, and an inner upper wall of the processing chamber 11 is covered by an upper wall member 14. The side wall member 13 and the upper wall member 14 are formed of, for example, aluminum. In side wall member 13 and the upper wall member 14, surfaces facing the processing space PS are coated with Yttria or anodized to have a predetermined thickness. Since the processing chamber 11 is electrically grounded, electric potentials of the side wall member 13 and the upper wall member 14 are a ground potential.

The holding stage 12 includes a conductor portion 15 formed of a conductive material, for example, aluminum, a side coating member 16 formed of an insulating material and covering a side surface of the conductor portion 15, an enclosure member 17 formed of quartz (Qz) and placed on the side coating member 16, and a holding stage base portion 15a formed of an insulating material and located under the conductor portion 15.

An exhaust passage 18 is formed between the inner wall of the processing chamber 11 and a side wall of the holding stage 12 in the processing chamber 11 and functions as a passage for exhausting a processing gas introduced into the processing space PS to outside of the processing chamber 11. An exhaust plate 19 is disposed in the exhaust passage 18 and is a plate shaped member having a plurality of communication holes. The exhaust plate 19 isolates the exhaust passage 18 from an exhaust space ES that is a lower space of the processing chamber 11. A rough pumping exhaust pipe 20 and a main exhaust pipe 21 are connected to the exhaust space ES. A dry pump (not shown) is connected to the rough pumping exhaust pipe 20, and a turbo molecular pump (not shown) is connected to the main exhaust pipe 21. The processing space PS may be set as a depressurized atmosphere at a predetermined pressure by the dry pump and the turbo molecular pump.

Meanwhile, an inlet/outlet 44 of the semiconductor wafer W is formed in the side wall of the processing chamber 11. A gate valve 46 for opening/closing the corresponding inlet/outlet 44 is provided on the inlet/outlet 44.

A first radio frequency (RF) power source 22 is connected to the conductor portion 15 of the holding stage 12 via a first matcher 23. The first RF power source 22 is to generate plasma, and supplies an RF power of a relatively high frequency (27 MHz or greater, for example, 40 MHz) to the conductor portion 15. The first matcher 23 reduces reflection of the RF power reflected from the conductor portion 15, and thereby increasing efficiency of supplying the RF power to the conductor portion 15.

A second RF power source 24 is additionally connected to the conductor portion 15 via a second matcher 25. The second RF power source 24 is to implant ions (bias), and supplies an RF power of a predetermined frequency (13.56 MHz or lower, for example, 3.2 MHz) that is lower than the frequency of the RF power supplied from the first RF power source 22, to the conductor portion 15.

An electrostatic chuck 27 having a structure in which an electrode plate 26 is received in a dielectric is arranged in an upper portion of the holding stage 12. A DC power source 28 for the electrostatic chuck is electrically connected to the electrode plate 26 of the electrostatic chuck 27. When a DC voltage is applied from the DC power source 28 for the electrostatic chuck to the electrode plate 26, the semiconductor wafer W is absorbed and held against an upper surface of the electrostatic chuck 27 by Coulomb force or Johnson-Rahbek force.

A focus ring 29 of a circular shape is arranged on the upper portion of the holding stage 12 so as to surround the semiconductor wafer W absorbed and held against the upper surface of the holding stage 12. The focus ring 29 is formed of silicon (Si), silica ($SiO_2$), silicon carbide (SiC), or the like. A cover ring 30 having a circular shape and formed of quartz is arranged around the focus ring 29 to protect a side surface of the focus ring 29.

A refrigerant chamber 31 of a circular shape that is extended in a circumferential direction is formed in the holding stage 12. In the refrigerant chamber 31, a refrigerant, for example, cooling water or Galden (registered trademark) solution, at a predetermined temperature is circularly supplied from a chiller unit (not shown) via refrigerant pipe 32 so that a processing temperature of the semiconductor wafer W absorbed and held against the upper surface of the holding stage 12 is controlled by the refrigerant.

A plurality of heat transfer gas supply holes 33 are opened in an absorption surface that absorbs and holds the semiconductor wafer W, on the upper surface of the holding stage 12. The plurality of heat transfer gas supply holes 33 are connected to a heat transfer gas supply unit (not shown) via a heat transfer gas supply line 34 disposed in the holding stage 12. The heat transfer gas supply unit supplies the heat transfer gas, for example, He gas to a gap between the absorption surface and a rear surface of the wafer W through the heat transfer gas supply holes 33.

A plurality of pusher pins 35 are arranged in the holding stage 12 and are lift pins that freely protrude from the upper surface of the holding stage 12. The pusher pins 35 are received in the holding stage 12, when an etching process is performed with respect to the semiconductor wafer W absorbed and held against the absorption surface. When the semiconductor wafer W is transferred into/out of the holding stage 12, the pusher pins 35 protrude from the absorption surface to hold the semiconductor wafer W above the holding stage 12.

A shower head 36 functioning as an upper electrode is arranged on a ceiling portion of the processing chamber 11 to face the holding stage 12. The shower head 36 and the holding stage 12 are configured to function as a pair of electrodes (upper and lower electrodes). The shower head 36 includes a cooling plate 38, an upper electrode plate 39 held by the cooling plate 38, and a cover body 40 which covers the cooling plate 38. The cooling plate 38 is a disc shape, is formed of an insulating material, and has a buffer chamber 37 therein.

The upper electrode plate 39 is formed in a disc shape, a lower surface of which is exposed to the processing space PS, and formed of a conductive material, for example, silicon. A peripheral portion of the upper electrode plate 39 is covered by a shield ring 41 of a circular shape that is formed of an insulating material. That is, the upper electrode plate 39 is electrically insulated from a wall portion of the processing chamber 11 having ground potential, by the cooling plate 38 and the shield ring 41.

The upper electrode plate 39 is electrically connected to an upper DC power source 42. A negative DC voltage is applied from the upper DC power source 42 to the upper electrode plate 39 so that the DC voltage may be applied to the processing space PS.

A processing gas introducing pipe 43 is connected to the buffer chamber 37 of the cooling plate 38. The processing gas introducing pipe 43 is connected to a processing gas supply unit (not shown). A plurality of gas through holes 48 connecting the buffer chamber 37 to the processing space PS are arranged in the shower head 36. The shower head 36 supplies the processing gas, which is supplied from the processing gas introducing pipe 43 to the buffer chamber 37, to the processing space PS through the gas through holes 48.

Figure 2:
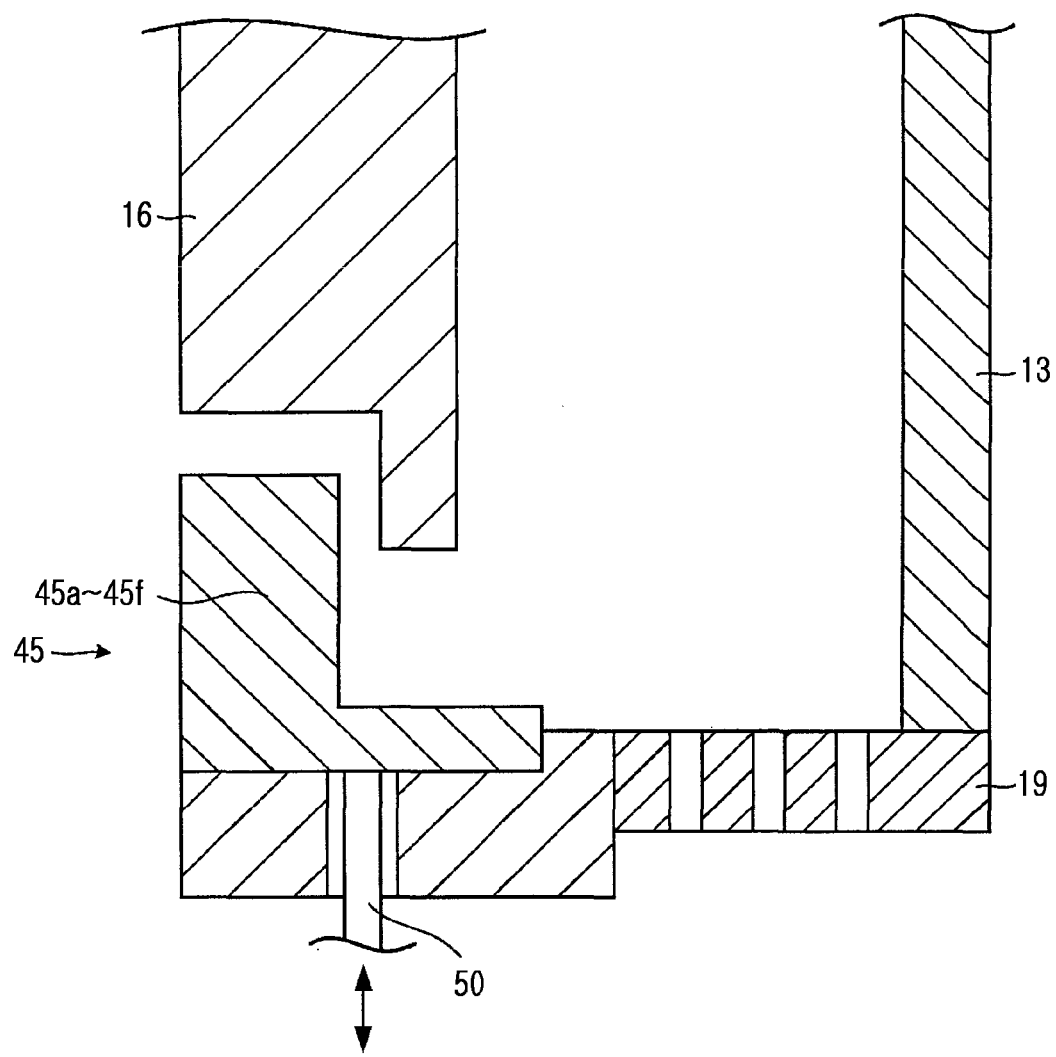
FIG. 2 is a schematic view of principal parts in the plasma etching apparatus of FIG. 1.

As shown in FIG. 2, a ground ring 45 (ground electrode) that is a ground member for the DC voltage is arranged in the processing chamber 11. The ground ring 45 has an L-shaped cross-section and an overall annular shape. The ground ring 45 may be formed of a conductive material, for example, a pure member of aluminum or silicon, and is arranged such that an outer side surface of the ground ring 45 is exposed to the processing space PS. The ground ring 45 functions as a ground electrode for the DC voltage applied to the upper electrode plate 39.

The ground ring 45 is disposed to cover a side surface of the holding stage base portion 15a on a lower portion of the side coating member 16 of the holding stage 12. Therefore, at least an outer portion of the ground ring 45 is exposed to the exhaust passage 18 in the processing space PS. Electrons emitted from the upper electrode plate 39 reach the ground ring 45, and accordingly, direct current flows in the processing space PS. The ground ring 45 will be described in more detail later.

In the plasma etching apparatus 10 having the above structure, the RF powers are supplied to the processing space PS so as to generate plasma of high density from the processing gas supplied into the processing space PS from the shower head 36, and additionally, the generated plasma is maintained in a desired state by the direct current flowing in the processing space PS, thereby performing an etching process of the wafer W by using the plasma.

As shown in FIG. 3, according to the present embodiment, the ground ring 45 is configured to have six arc-shaped members 45a through 45f forming an overall ring shape. The six arc-shaped members 45a through 45f have the same size as each other. That is, the ground ring is formed like one ring-shaped member is divided into six pieces. When the ground ring 45 is configured to have a plurality of arc-shaped members, the number of arc-shaped members may be 4 or greater.

As shown in FIG. 2, a vertical movement mechanism 50 is arranged on a rear surface side of each of the arc-shaped members 45a through 45f. FIG. 2 shows only one of the six vertical movement mechanisms 50 corresponding to the six arc-shaped members 45a through 45f.

Upper end portions of a driving shaft of the vertical movement mechanism 50 are connected respectively to the rear surface of each of the arc-shaped members 45a through 45f. Each of the arc-shaped members 45a through 45f may be independently moved in a vertical direction as denoted by an arrow of FIG. 2. The vertical movement mechanisms 50 move the arc-shaped members 45a through 45f in the vertical direction to change connecting states of the arc-shaped members 45a through 45f with respect to the ground potential.

According to the present embodiment, the arc-shaped members 45a through 45f contact the exhaust plate 19 in a descended state as shown in FIG. 2, so as to be connected to the ground potential. When the arc-shaped members 45a through 45f are ascended by the vertical movement mechanisms 50, the connecting states of the arc-shaped members 45a through 45f with respect to the ground potential are weakened. Moreover, the arc-shaped members 45a through 45f may be set in electrically floated states by ascending the arc-shaped members 45a through 45f until the arc-shaped members 45a through 45f are completely separated from the exhaust plate 19.

On the other hand, it may be configured that the arc-shaped members 45a through 45f are connected to the ground potential in a state where the arc-shaped members 45a through 45f are ascended, and are electrically floated in a state where the arc-shaped members 45a through 45f are descended.

As described above, when the ground ring 45 is configured to have the plurality of arc-shaped members 45a through 45f, each of the arc-shaped members 45a through 45f may be electrically connected to each other. Otherwise, the ground ring 45 may not include the plurality of arc-shaped members 45a through 45f as described above, but the ground ring 45 may be formed of a ring-shaped member formed as a single body. In this case, the plurality of vertical movement mechanisms 50, for example, four or more vertical movement mechanisms 50 are arranged at regular intervals in a circumferential direction with respect to portions of the ground ring 45, and the connecting state of each portion of the ground ring 45 with respect to the ground potential may be adjusted by each of the vertical movement mechanisms 50.

Figure 4A:
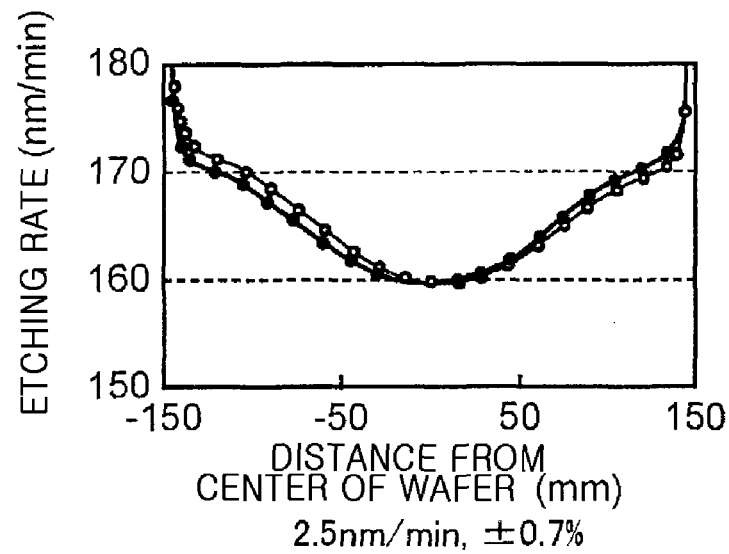
Figure 4B:
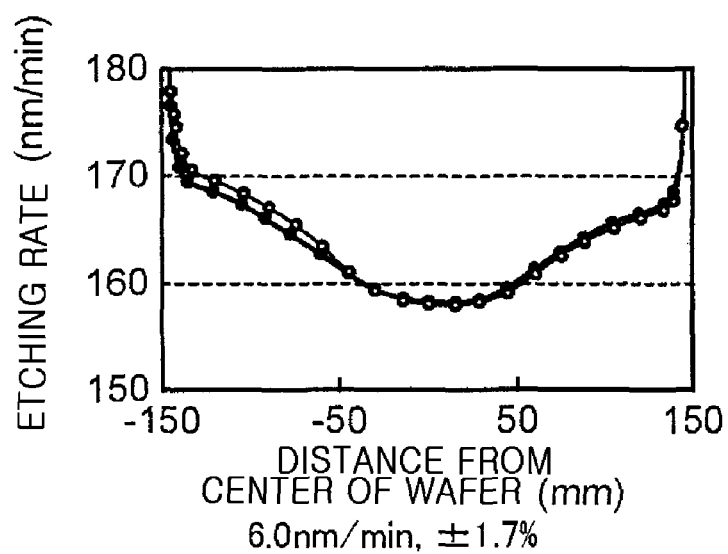
Figure 4C:
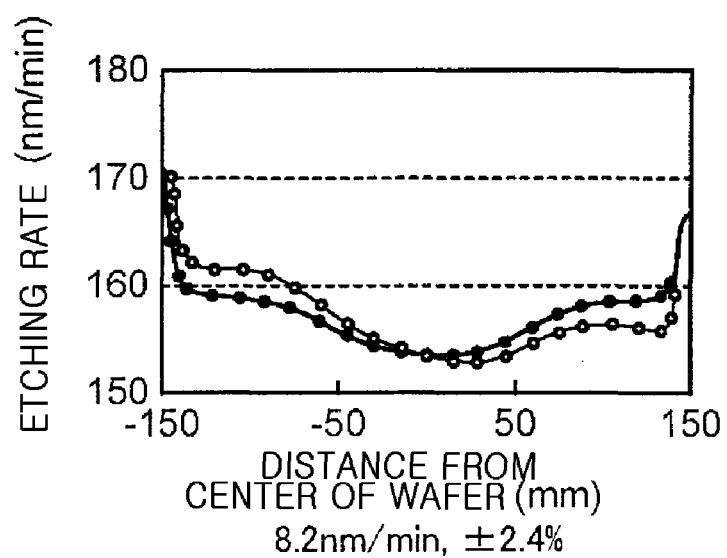

FIGS. 4A through 4C are graphs showing results of measuring etching rates on an X-axis and a Y-axis that cross each other at a right angle on the semiconductor wafer W, and an etching rate and a uniformity value on a periphery that is located at 3 mm inward (in a diameter direction) from an edge of the semiconductor wafer W. Longitudinal axes of the graphs denote etching rates, and transverse axes of the graphs denote a distance from a center of the semiconductor wafer W. Here, the ground ring 45 formed as a single body was used, and influences of a grounding state of the ground ring 45 on an etching state were examined. Etching conditions were as follows.

Processing gas: $CF_4/Ar=50/600$ sccm
Pressure: 5.32 Pa (40 mTorr)
RF power: 500/2000 W
DC voltage: 300 V
Temperatures (holding stage/ceiling portion and side wall portion): 20/150° C.
He pressure (center/edge): 1995/5320 Pa (15/40 Torr)
Time: 60 seconds FIG. 4A is a graph when a spiral type electric connecting member for improving the electric connecting state is disposed on an entire rear surface of the ground ring 45. FIG. 4B is a graph when an insulating material (kapton material) is disposed on a right 50% portion of the rear surface side of the ground ring 45 in the state of FIG. 4A and then the connecting state with respect to the ground potential is changed. FIG. 4C is a graph when the insulating material is disposed on the entire rear surface side of the ground ring 45 and then the connecting state with respect to the ground potential is changed. As shown in FIG. 4B, when the insulating material is disposed on the right 50% portion, in-plane uniformity of the etching rate is changed from that of the case where the insulating material is not disposed. In addition, as shown in FIG. 4C, when the entire ground ring 45 is floated, the in-plane uniformity of the etching rate is greatly degraded, and thus a plasma leak concurs accompanied with the degradation of the etching rate. Therefore, at least a part of the ground ring 45 may be connected to the ground potential.

Figure 5A:
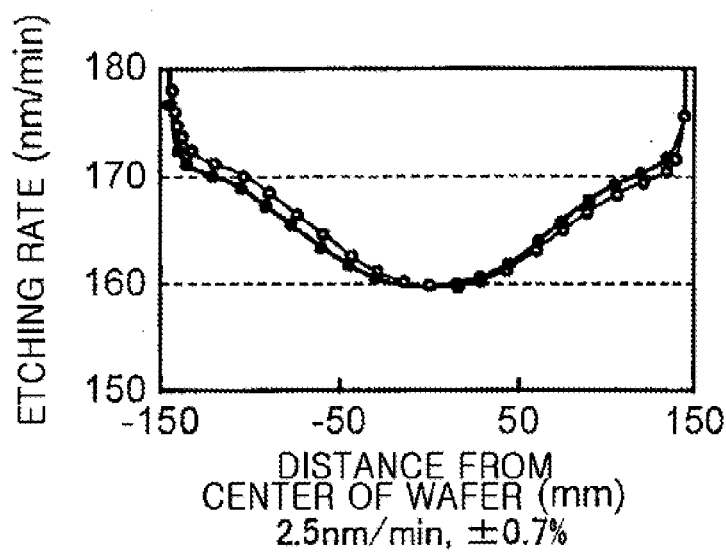
FIGS. 5A through 5C are graphs showing examination results of an influence of a grounding state of a ground member for a direct current (DC) voltage on uniformity of process.
Figure 5B:
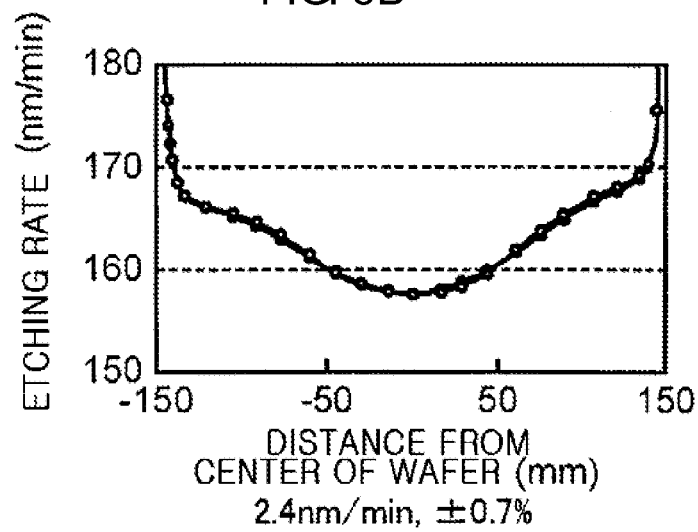
Figure 5C:
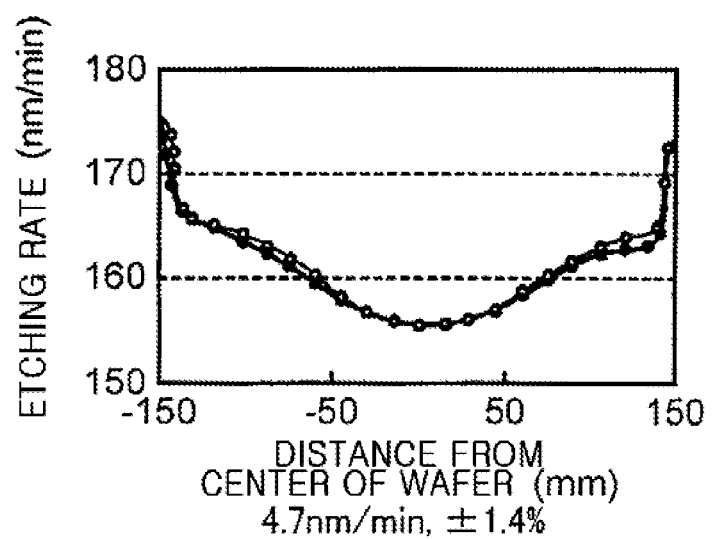

FIGS. 5A through 5C are graphs showing results of measuring influences on etching states when tightening torques of attaching screws for attaching the ground ring 45 are changed, and an etching rate and a uniformity value on a periphery that is located 3 mm inward (in a diameter direction) from the edge of the semiconductor wafer W. FIG. 5A is a graph in a case where the tightening torques of all attaching screws are 6 kgf. FIG. 5B is a graph in a case where the tightening torque of one attaching screw is 6 kgf and the other screws are not tightened. FIG. 5C is a graph in a case where all of the attaching screws are not tightened.

As shown in the graphs of FIGS. 5A through 5C, the in-plane uniformity of an etching process is changed according to the tightening torques of the attaching screws, and when all of the attaching screws are not tightened, the in-plane uniformity of an etching process is apparently degraded.

As described above, it is identified that the in-plane uniformity of an etching process in the circumferential direction is changed by partially changing the grounding state of a part of the ground ring 45. Therefore, in the plasma etching apparatus 10 according to the present embodiment, the uniformity of an etching process in the circumferential direction may be controlled by changing the grounding states of the arc-shaped members 45a through 45f forming the ground ring 45 by moving the arc-shaped members 45a through 45f and the vertical movement mechanisms 50 in the vertical direction.

Next, plasma etching processes of a thin film formed on the semiconductor wafer W in the plasma etching apparatus 10 having the above structure will be described as follows. First, the gate valve 46 is opened, the semiconductor wafer W is carried into the processing chamber 11 from a load lock module (not shown) through the inlet/outlet 44 by a transfer robot (not shown), and then the semiconductor wafer W is held on the holding stage 12. After that, the transfer robot is retrieved out of the processing chamber 11, and the gate valve 46 is closed. In addition, the inside of the processing chamber 11 is exhausted through the rough pumping exhaust pipe 20 and the main exhaust pipe 21 by a vacuum pump (not shown).

When the inside of the processing chamber 11 reaches a predetermined vacuum level, a predetermined processing gas (etching gas) is introduced into the processing chamber 11 through the shower head 36 and the inside of the processing chamber 11 is held at a predetermined pressure. In this state, an RF power of a frequency of, for example, 40 MHz, is supplied from the first RF power source 22 to the holding stage 12. In addition, an RF power (for bias) of a frequency of, for example, 3.2 MHz, is supplied from the second RF power source 24 to the holding stage 12 for implanting ions. Here, a predetermined DC voltage (for example, a DC voltage of +2500 V) is applied from the DC power source 28 for the electrostatic chuck to the electrode plate 26 of the electrostatic chuck 27, and the semiconductor wafer W is absorbed and held against the electrostatic chuck 27 by Coulomb force or Johnson-Rahbek force.

As described above, when the RF powers are applied to the holding stage 12 that is the lower electrode, an electric field is generated between the shower head 36 that is the upper electrode and the holding stage 12 that is the lower electrode. A discharge occurs in the processing space PS, in which the semiconductor wafer W exists, due to the electric field, and accordingly, a thin film formed on the semiconductor wafer W is etched by plasma of the processing gas generated due to the discharge.

In addition, since the DC voltage may be applied to the shower head 36 from the upper DC power source 42 during the plasma process, following effects may be obtained. For example, some processes may require plasma of high electron density and low ion energy. In this case, when the DC voltage is applied to the shower head 36, ion energy introduced to the semiconductor wafer W is restrained, whereas electron density of the plasma is increased. Thus, an etching rate of a film to be etched on the semiconductor wafer W is increased and a sputtering rate toward a film acting as a mask on the film to be etched is reduced, and thus a selectivity of the plasma process is improved.

Here, the etching process may not be uniform in the circumferential direction according to an attaching state of the ground ring 45 that functions as the ground electrode with respect to the DC voltage applied to the shower head 36. In this case, according to the conventional art, the processing chamber 11 is opened to the atmosphere and the attaching state of the ground ring 45 is adjusted to address the non-uniformity of the process. However, according to the present embodiment, the grounding states of the arc-shaped members 45a through 45f forming the ground ring 45 are changed by moving the arc-shaped members 45a through 45f vertically by using the vertical movement mechanisms 50, and thus the non-uniformity of the process may be corrected easily and rapidly without opening the processing chamber 11 to the atmosphere. Accordingly, processing efficiency may be greatly improved. In addition, the embodiment of the present invention may be applied to a control for reducing a processing bias (instrument error) between the processing chambers 11 or to a control of uniformity in a large-sized wafer (for example, 450 mm).

In addition, when the etching process is finished, the supply of the RF powers, the supply of the DC voltage, and the supply of the processing gas are stopped, and the semiconductor wafer W is carried out of the processing chamber 11 in an order opposite to the above stated order.

As described above, according to the embodiment of the present invention, a biased process according to an installation state of the ground ring 45, which is the ground member for the DC voltage that is applied to the shower head 36 as the upper electrode, may be easily corrected, and thus processes may be performed uniformly and efficiently. In addition, the present invention is not limited to the above described embodiment, and variously modified.

According to the present invention, the plasma processing apparatus capable of performing processes uniformly and efficiently by easily correcting a biased process caused due to an installation state of a ground member for a DC voltage applied to an upper electrode may be provided.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A plasma processing apparatus comprising:
a processing chamber having a processing space inside;
a lower electrode arranged in the processing chamber and functioning as a holding stage where a substrate is held;
an upper electrode arranged in the processing chamber to face the lower electrode;
a radio frequency (RF) power source which applies an RF power to the lower electrode;
a direct current (DC) power source which applies a DC voltage to the upper electrode;
a processing gas supply mechanism which supplies a processing gas to the processing space, the processing gas being plasmatized in the processing space;
a ground member for the DC voltage which has an overall ring shape, is formed of a conductive material, is arranged to surround the lower electrode in a position lower than a substrate-holding position of the holding stage in the processing chamber such that at least a part of the ground member is exposed to the processing space, and forms a ground potential with respect to the DC voltage applied to the upper electrode;

a focus ring of a circular shape which is arranged in a position higher than the ground member, and around the holding stage so as to surround the substrate-holding position; and a plurality of vertical movement mechanisms which are configured to move the ground member for the DC voltage in a vertical direction to adjust a grounding state of the ground member for the DC voltage, wherein the ground member is in a state of being connected to a ground potential when the ground member is in a descended state and a bottom portion of the ground member contacts a grounded source, and the ground member is in a state of being electrically floated when the ground member is ascended by the vertical movement mechanisms and the bottom portion of the ground member does not contact the grounded source, wherein the vertical movement mechanisms are configured such that a height of uppermost portion of the ground member ascended by the vertical movement mechanisms is lower than the height of the substrate-holding position of the holding stage.

2. The plasma processing apparatus of claim 1, wherein the ground member for the DC voltage is formed of silicon.

3. The plasma processing apparatus of claim 1, wherein the ground member for the DC voltage is formed of a pure member of aluminum.

4. The plasma processing apparatus of claim 1, wherein the ground member for the DC voltage is configured to have a plurality of arc-shaped members forming an overall ring shape, and the vertical movement mechanisms are arranged respectively on the arc-shaped members.

5. The plasma processing apparatus of claim 4, wherein the ground member for the DC voltage comprises four or more arc-shaped members.

6. The plasma processing apparatus of claim 4, wherein each of the vertical movement mechanisms is configured to move independently each of the arc-shaped members in a vertical direction.

7. A plasma processing apparatus comprising:
a processing chamber having a processing space inside;
a lower electrode arranged in the processing chamber and functioning as a holding stage where a substrate is held;
an upper electrode arranged in the processing chamber to face the lower electrode;
a radio frequency (RF) power source which applies an RF power to the lower electrode;
a direct current (DC) power source which applies a DC voltage to the upper electrode;
a processing gas supply mechanism which supplies a processing gas to the processing space, the processing gas being plasmatized in the processing space;
a ground member for the DC voltage which has an overall ring shape, is formed of a conductive material, is arranged to surround the lower electrode in a position lower than a substrate-holding position of the holding stage in the processing chamber such that at least a part of the ground member is exposed to the processing space, and forms a ground potential with respect to the DC voltage applied to the upper electrode;
a focus ring of a circular shape which is arranged in a position higher than the ground member, and around the holding stage so as to surround the substrate-holding position; and
a plurality of vertical movement mechanisms which are configured to move the ground member for the DC voltage in a vertical direction to adjust a grounding state of the ground member for the DC voltage, wherein the ground member is in a state of being connected to a ground potential when the ground member is ascended by the vertical movement mechanisms and an upper portion of the ground member contacts a grounded source, and the ground member is in a state of being electrically floated when the ground member is in a descended state and the upper portion of the ground member does not contact the grounded source, wherein the vertical movement mechanisms are configured such that a height of uppermost portion of the ground member ascended by the vertical movement mechanisms is lower than the height of the substrate-holding position of the holding stage.

8. The plasma processing apparatus of claim 7, wherein the ground member for the DC voltage is formed of silicon.

9. The plasma processing apparatus of claim 7, wherein the ground member for the DC voltage is formed of a pure member of aluminum.

10. The plasma processing apparatus of claim 7, wherein the ground member for the DC voltage is configured to have a plurality of arc-shaped members forming an overall ring shape, and the vertical movement mechanisms are arranged respectively on the arc-shaped members.

11. The plasma processing apparatus of claim 10, wherein the ground member for the DC voltage comprises four or more arc-shaped members.

12. The plasma processing apparatus of claim 10, wherein each of the vertical movement mechanisms is configured to move independently each of the arc-shaped members in a vertical direction.

13. A plasma processing apparatus comprising:
a processing chamber having a processing space inside;
a lower electrode arranged in the processing chamber and functioning as a holding stage where a substrate is held;
an upper electrode arranged in the processing chamber to face the lower electrode;
a radio frequency (RF) power source which applies an RF power to the lower electrode;
a direct current (DC) power source which applies a DC voltage to the upper electrode;
a processing gas supply mechanism which supplies a processing gas to the processing space, the processing gas being plasmatized in the processing space;
a ground member for the DC voltage which has an overall ring shape, is formed of a conductive material, and is arranged in a position lower than a substrate-holding position of the holding stage in the processing chamber such that at least a part of the ground member is exposed to the processing space, and forms a ground potential with respect to the DC voltage applied to the upper electrode, wherein the ground member is divided into a plurality of arc-shaped members forming the overall ring shape;
a focus ring of a circular shape which is arranged in a position higher than the ground member, and around the holding stage so as to surround the substrate-holding position; and
a plurality of vertical movement mechanisms each operatively connected to each corresponding arc-shaped member, wherein each of the vertical movement mechanisms is configured to move the corresponding arc-shaped member in a vertical direction independently from other arc-shaped members to thereby adjust a grounding state of the ground member, wherein the vertical movement mechanisms are configured such that a height of uppermost portion of the ground member ascended by the vertical movement mechanisms is lower than the height of the substrate-holding position of the holding stage.

* * * * *